(12) United States Patent
Toth et al.

(10) Patent No.: US 8,303,833 B2
(45) Date of Patent: Nov. 6, 2012

(54) HIGH RESOLUTION PLASMA ETCH

(75) Inventors: Milos Toth, Cambridge, MA (US); Noel Smith, Lake Oswego, OR (US)

(73) Assignee: FEI Company, Hillsboro, OR (US)

( * ) Notice: Subject to any disclaimer, the term of this patent is extended or adjusted under 35 U.S.C. 154(b) by 1129 days.

(21) Appl. No.: 11/766,680

(22) Filed: Jun. 21, 2007

(65) Prior Publication Data

US 2008/0314871 A1    Dec. 25, 2008

(51) Int. Cl.
*B44C 1/22* (2006.01)
*C03C 15/00* (2006.01)
*C03C 25/68* (2006.01)
*C23F 1/00* (2006.01)

(52) U.S. Cl. .................. 216/63; 216/41; 216/67
(58) Field of Classification Search .............. 216/63, 216/41, 66, 62
See application file for complete search history.

(56) References Cited

U.S. PATENT DOCUMENTS

| | | |
|---|---|---|
| 4,609,809 A | 9/1986 | Yamaguchi et al. |
| 4,737,637 A | 4/1988 | Knauer |
| 4,740,267 A | 4/1988 | Knauer et al. |
| 4,833,319 A | 5/1989 | Knauer |
| 4,856,457 A | 8/1989 | Knauer |
| 4,859,908 A | 8/1989 | Yoshida et al. |
| 4,874,459 A | 10/1989 | Coldren et al. |
| 5,055,696 A | 10/1991 | Haraichi et al. |
| 5,108,535 A | 4/1992 | Ono et al. |
| 5,188,705 A | 2/1993 | Swanson et al. |
| 5,221,422 A | 6/1993 | Das et al. |
| 5,350,480 A | 9/1994 | Gray |
| 5,482,802 A | 1/1996 | Celler et al. |
| 5,573,595 A | 11/1996 | Dible |
| 5,686,796 A | 11/1997 | Boswell et al. |
| 5,827,786 A | 10/1998 | Puretz |
| 6,042,738 A | 3/2000 | Casey, Jr. et al. |
| 6,127,275 A | 10/2000 | Flamm |
| 6,211,527 B1 | 4/2001 | Chandler |
| 6,239,404 B1 | 5/2001 | Lea et al. |
| 6,268,608 B1 | 7/2001 | Chandler |
| 6,303,932 B1 | 10/2001 | Hamamura et al. |
| 6,544,897 B2 * | 4/2003 | Kaito .......................... 438/710 |

(Continued)

FOREIGN PATENT DOCUMENTS

JP    59104287    6/1984

(Continued)

OTHER PUBLICATIONS

Hopwood, J., 'A Microfabricated Inductively-Coupled Plasma Generator,' Journal of Microelectronmechanical Systems, 9(3), 309-313, (2000).

(Continued)

*Primary Examiner* — Roberts Culbert
(74) *Attorney, Agent, or Firm* — Scheinberg & Associates, PC; Michael O. Scheinberg

(57) ABSTRACT

A method for fabrication of microscopic structures that uses a beam process, such as beam-induced decomposition of a precursor, to deposit a mask in a precise pattern and then a selective, plasma beam is applied, comprising the steps of first creating a protective mask upon surface portions of a substrate using a beam process such as an electron beam, focused ion beam (FIB), or laser process, and secondly etching unmasked substrate portions using a selective plasma beam etch process. Optionally, a third step comprising the removal of the protective mask may be performed with a second, materially oppositely selective plasma beam process.

22 Claims, 2 Drawing Sheets

U.S. PATENT DOCUMENTS

| | | | |
|---|---|---|---|
| 6,730,237 B2 * | 5/2004 | Sievers et al. | 216/62 |
| 6,753,538 B2 | 6/2004 | Musil et al. | |
| 6,768,120 B2 | 7/2004 | Leung et al. | |
| 6,770,836 B2 | 8/2004 | Kwon et al. | |
| 6,833,051 B2 | 12/2004 | Kazumi et al. | |
| 6,838,380 B2 | 1/2005 | Bassom et al. | |
| 6,977,386 B2 | 12/2005 | Gerlach et al. | |
| 7,241,361 B2 | 7/2007 | Keller et al. | |
| 7,326,942 B2 | 2/2008 | Shichi et al. | |
| 7,670,956 B2 | 3/2010 | Bret et al. | |
| 2001/0025826 A1 | 10/2001 | Pierson et al. | |
| 2005/0183667 A1 * | 8/2005 | Keller et al. | 118/723 I |
| 2006/0045987 A1 * | 3/2006 | Chandler et al. | 427/569 |
| 2008/0135779 A1 | 6/2008 | Shichi et al. | |

FOREIGN PATENT DOCUMENTS

| | | |
|---|---|---|
| JP | S59-132132 A | 7/1984 |
| JP | H02-062039 A | 3/1990 |
| JP | H04-272640 A | 9/1992 |
| JP | H05-017300 A | 1/1993 |
| JP | 05315212 A * | 11/1993 |
| JP | H07-502863 A | 3/1995 |
| JP | H09-045639 A | 2/1997 |
| JP | H09-199475 A | 7/1997 |
| JP | 2000-183045 A | 6/2000 |
| JP | 2005-174591 A | 6/2005 |
| JP | 2006-005110 A | 1/2006 |
| JP | 2006-128068 A | 5/2006 |
| JP | 2007018928 | 1/2007 |
| WO | 2008094297 | 8/2008 |

OTHER PUBLICATIONS

Yin, Y., J. Messier, and J. Hopwood, 'Miniaturization of Inductively Coupled Plasma Sources,' IEEE Trans. Plasma Science, vol. 27, No. 5, pp. 109-116, 1992.

U.S. Appl. No. 11/590,570, filed Apr. 4, 2007, Chandler et al.

Orloff, Jon (editor), "Handbook of Charged Particle Beam Optics", pp. 447-453, 1997, CRC Press.

JP Patent Application No. 2008-153992 Office Action dated Apr. 25, 2012.

* cited by examiner

HIGH RESOLUTION PLASMA ETCH

TECHNICAL FIELD OF THE INVENTION

The present invention relates to materials processing on a microscopic scale.

BACKGROUND OF THE INVENTION

Modern technology demands the fabrication of ever smaller and more precise structures for electronic circuits, optical components, micro electromechanical structures (MEMS), and other applications. Many such structures and devices, on the scale of micrometers or nanometers, are fabricated on silicon wafers using photolithographic methods.

A typical photolithography technique involves depositing a thin layer of a photosensitive material called a "photoresist" onto the surface of a semiconductor substrate such as a silicon wafer, by a process called "casting." Photolithographic imaging is then used to transfer a desired pattern, designed on a photolithographic mask, to the photoresist by selective exposure to a radiation source such as light. The photoresist is then chemically developed to remove the radiation exposed areas (in a positive resist) or the unexposed areas (in a negative resist), leaving behind a pattern of photoresist to protect specific parts of the substrate during subsequent processes such as etching (removing material), deposition (adding material to the substrate surface), or diffusion (diffusing atoms into the substrate). Etching can be performed, for example, using a reactive chemical, sometimes in the form of a plasma. A plasma can also be used to sputter material from a surface by causing charged particles from the plasma to impact the surface with sufficient momentum to displace surface molecules. Deposition can be performed, for example, by chemical or physical vapor deposition or plasma enhanced chemical vapor deposition. After processing, the patterned photoresist is removed. Lithography process are time consuming and, while efficient for processing a complete wafer, are less useful for localized processing.

Focused beams, such as focused ion beams (FIBs), electron beams, and laser beams, are also used for forming small structures. While being able to form extremely precise structures, processing by such beams is typically too slow to be used for mass production of fine structures. FIBs can be used to sputter a substrate surface because they employ a relatively large ion such as, for example, a gallium ion ($Ga^+$) that can be accelerated easily to achieve the momentum needed to displace molecules of the substrate. FIBs can also be used with a precursor gas to enhance etching chemically or to deposit a material onto the surface. Electron beams can also be used, together with an assisting precursor gas, to give rise to etching or deposition processes.

Electron beam, FIB, reactive gasses and plasma processes can be used either alone or in combination with one another to manipulate substrate surfaces, for example, to create and repair photolithographic masks. Reactive gasses typically also exhibit material selectivity. These processes can provide varying degrees of fabrication tolerances, material characteristics, processing times and machining flexibility.

Many problems still exist, however, with the methods of fabrication as currently used and described above. For example, it is difficult to precisely fabricate high aspect ratio holes, that is, holes having a depth that is much greater than their widths. Because current fabrication processes cause holes or trenches to become wider as they are etched deeper, adjacent deep features must be spaced further apart than desired. Time consuming photolithography processes are efficient for processing entire wafers, but are not useful for processing local regions on a wafer. Conversely, direct-write FIB and electron beam induced processes are efficient for highly localized processing employed in nano-prototyping, circuit edit, and photolithographic mask repair, but are not useful for processing entire wafers.

SUMMARY OF THE INVENTION

An object of the invention is to provide a method and apparatus for fabricating structures on the micro and nano scales.

In accordance with the foregoing objects, the present invention includes creating a protective coating upon portions of a substrate preferably using a focused beam process and then etching unmasked substrate portions using a material selective plasma beam formed using an ion focusing column positioned between a plasma chamber and the substrate.

Finally, many other features, objects and advantages of the present invention will be apparent to those of ordinary skill in the relevant arts, especially in light of the foregoing discussions and the following drawings, exemplary detailed description and appended claims.

BRIEF DESCRIPTION OF THE DRAWINGS

Although the scope of the present invention is much broader than any particular embodiment, a detailed description of the preferred embodiment follows together with illustrative figures, wherein like reference numerals refer to like components, and wherein.

DETAILED DESCRIPTION OF THE PREFERRED EMBODIMENT

Although those of ordinary skill in the art will readily recognize many alternative embodiments, especially in light of the examples provided herein, this detailed description is exemplary of a preferred embodiment of the present invention, the scope of which is limited only by the claims appended hereto.

Preferred embodiments of the invention relate to a method for fabricating nanoscopic and microscopic structures, such as integrated circuits or micro-electromechanical systems, by a beam used to locally fabricate a protective mask, followed by use of a plasma beam etch process.

Where lithography is typically used for pattern definition in micromachining, beam processes as used in preferred embodiments of the present invention create precisely defined protective mask patterns on a substrate surface and, when followed by etching using a plasma beam, contribute to superior structural tolerances and machining flexibility. For example, beam deposition can produce surface features such as line widths of less than about 10 nm.

Figure 1:
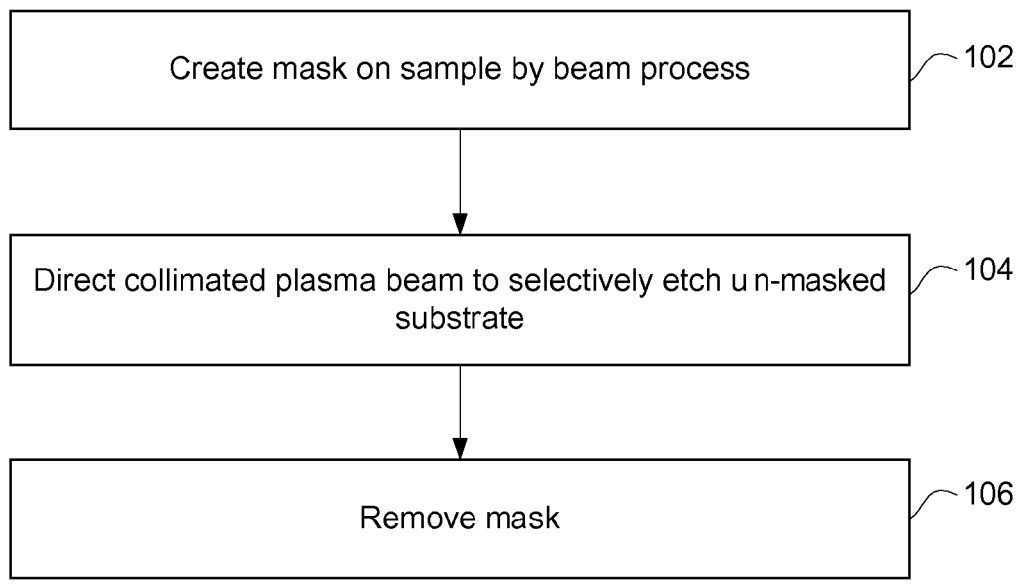
FIG. 1 is a flowchart showing the preferred order of processing of the present invention.
Figure 2:
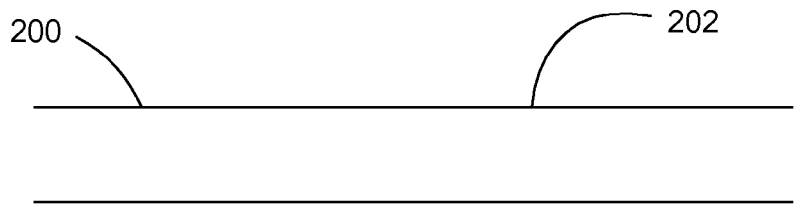
FIG. 2 shows an elevated side view of a substrate sample having an upper surface.

Referring now to the FIGS, FIG. 1 is a flowchart that shows a preferred order of steps of a method of the present invention. FIGS. 2 through 4 and FIG. 6 illustrate the various stages of processing of a substrate in accordance with the method shown in FIG. 1. FIG. 2 shows a sample substrate 200 having a surface 202 before processing begins.

In step 102, a focused beam (e.g., with a beam diameter in the range of 1 nm to 100 μm, and more commonly in the range of 1 nm to 10 nm) is used to fabricate a protective layer to mask a portion of the substrate surface to protect the masked portion during a subsequent etching step. For example, the beam can be used to deposit a masking material using beam-assisted deposition, or the beam can be used to etch a pattern in a layer of mask material previously deposited by other known methods. In one preferred embodiment, the beam is used to deposit a material that will coordinate with the subsequent etching step insofar the deposited material is etched less by the subsequent process than the exposed or un-masked surface of the substrate material. Beam processes such as those used in preferred step 102 typically produce higher definition protective layers than are available through photolithographic means. Furthermore, beam processes are able to process arbitrary regions of a substrate immediately after inspection using the focused beam, without the need to fabricate conventional photolithographic masks. This makes beam processes particularly useful for one-off modifications such as those encountered in photolithographic mask repair, circuit edit, and nanostructure prototyping. Beam processes are, in general, especially suited to localized deposition, by which is meant deposition on a portion of the substrate that is significantly smaller than the entire substrate.

Figure 3:
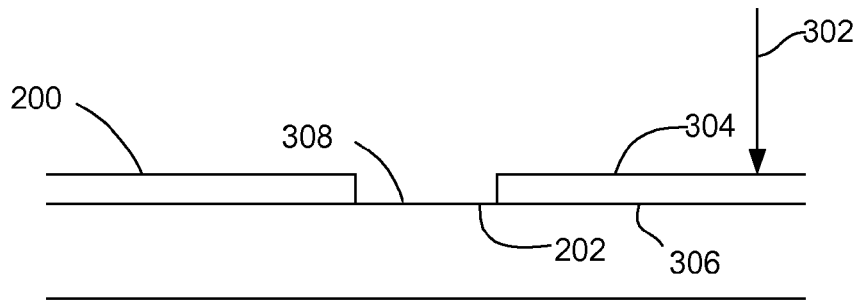
FIG. 3 shows the substrate of FIG. 2 further showing portions of a protective mask upon the surface.

FIG. 3 shows using a beam 302 to deposit a protective layer or mask 304 upon one or more portions 306 of the surface 202, leaving behind an unmasked region 308 to be processed by a plasma beam as will be better understood further herein. In a preferred embodiment, beam 302 comprises a charged particle beam, such as an electron beam. A method for electron beam deposition is described, for example, in U.S. Pat. No. 6,753,538 to Musil, et al. entitled "Electron Beam Processing." Musil describes using an electron beam to deposit material by inducing a chemical reaction in a precursor gas that decomposes in the presence of the electron beam to leave an appropriate material on a surface. Preferable deposition precursor gasses include, for example, styrene ($C_6H_5CH=CH_2$) for depositing a carbon protective mask that is removed slowly by $XeF_2$ etch processes, and $WF_6$ (tungsten hexafluoride) or $W(CO)_6$ (tungsten hexacarbonyl) for depositing a tungsten-rich protective mask that is resistant to oxygen-based carbon etch precursors such as $H_2O$. Precursor gases that result in the deposition of an oxide layer include, for example, TEOS (tetraethylorthosilicate), which deposits a silicon oxide protective mask. Other precursors for electron beam deposition are known and can be used as well. Examples include perdeuterated gallium azide ($D_2GaN_3$) and $Pt(PF_3)_4$ (tetrakis(trifluorophosphane)platinum) for the deposition of masks rich in GaN and Pt, respectively.

Those of ordinary skill in the art of charged particle beam deposition will appreciate that deposition can be done across a range of electron beam energies and currents, depending on the deposition rate and resolution required. Generally, high beam current and low beam energy result in higher deposition rates, with an optimum beam energy of about 100 eV. Energies below this value typically result in lower deposition rates. However, for optimum resolution of the deposit, higher beam energies are typically required to give a smaller electron beam. Therefore, energies might reasonably range from about 1 keV to about 30 keV with conventional scanning electron microscopes (SEMs) such as, those available from FEI Company, the assignee of the present invention. Energies as high as 300 keV, typically used in transmission electron microscopes (TEMs), can also be used.

Preferred beam currents range from picoamps to nanoamps. However, there could be applications, for example, in some MEMS fabrication, where much higher currents in the microamp range are preferred when very high deposition rates are required and low resolution is acceptable. Typical electron beam spot sizes can range from 1 nm to 100 nm, while spot sizes ranging from 0.1 nm to 10 μm may be useful in some applications, spanning TEM systems and very high electron current SEM columns.

Alternatively, the beam 302 used to deposit material forming the protective mask 304 may be a FIB. In a FIB process used for deposition, a gas is directed toward a surface and a finely focused ion beam (typically comprising gallium ions), decomposes the gas molecules absorbed on the target surface and causes the metal products to become deposited. A process for depositing metal material using a FIB is described, U.S. Pat. No. 4,609,809 to Yamaguchi, et al. for "Method And Apparatus For Correcting Delicate Wiring of IC Device," which describes the use of a tungsten precursor gas compound in the presence of the FIB to deposit tungsten upon a substrate surface. Other precursor gasses that decompose in the presence of a FIB to deposit a material and can be used with the invention are described, for example, in Handbook of Charged Particle Beam Optics, Ed. Jon Orloff, CRC Press (1997). The ion beam can be focused to a point or shaped, as described for example, in U.S. Pat. No. 6,977,386 for "Angular Aperture Shaped Beam System and Method" to Gerlach et al., which patent is assigned to the assignee of the present invention. The term "focused beam" as used herein includes a shaped beam.

Laser-beam-induced deposition can also be used. The beam can deposit material by providing energy to decompose a precursor as described above, or the beam can be comprised include particles, such as fullerenes, that are deposited onto the surface, as described, for example in U.S. patent application Ser. No. 11/590,570 for "Charged-Particle Beam Processing Using a Cluster Source."

In any case, the methods of deposition, and the material deposited, are preferably such that the resulting protective mask 304 can be selectively removed in a subsequent mask-removal step, as will be described below. As described above, the mask can also be created by coating the area of interest with a layer of masking material, and then using the beam to remove material from the masking layer to form a desired pattern.

FIG. 1 shows that the second step 104 comprises directing a first collimated plasma beam toward the substrate surface, the beam selectively etching the substrate surface that is not covered by the mask at a significantly higher rate than it etches the protective mask. Preferably, the first plasma beam 402 exhibits a selective characteristic so that the unmasked material is preferably etched at a rate that is at least two times greater than the etch rate of the protective mask 304 material, more preferably five times greater, even more preferably ten times greater, and most preferably one hundred times greater.

Figure 4:
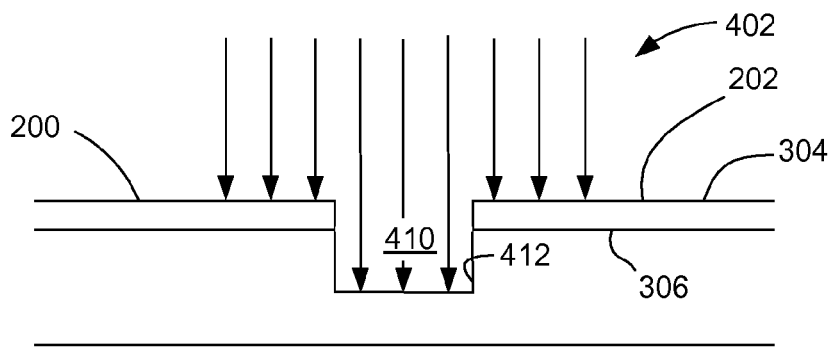
FIG. 4 shows a collimated plasma beam selectively etching an unprotected portion of the substrate of FIGS. 2 and 3.

Referring to FIG. 4, a first collimated plasma beam 402 is directed toward the surface 202 of the substrate sample 200 to etch the un-masked (un-protected) region. The preferred degree of collimation depends on the desired properties of the etched feature and the desired size of the beam. A more highly collimated beam produced more vertical sidewalls in the etched feature. The degree of collimation also affects the beam spot size. The first plasma beam 402 is preferably collimated and substantially unfocused, such that the beam spot area is preferably greater than the unmasked area of the substrate surface, but smaller than the area of the mask, That is, the plasma beam is preferably sufficiently broad to etch the entire unmasked region 308, although the plasma beam or sample can be moved to scan and etch all required regions in some embodiments. The plasma beam preferably has a constant ion flux profile across the entire unmasked etch region 308 to etch the area evenly. The ion flux is preferably constant to within about 20% across the unmasked area of the substrate surface, more preferably to within about 1%, even more preferably to within about 0.1% and most even preferably to within about 0.001%. Plasma beam 402 is local, that is, it covers an area that is significantly smaller that the entire sample. When used to etch high aspect ratio holes, plasma beam 402 is preferably highly collimated to avoid tapering the etching of the holes. In forming some features, such as low aspect ratio holes, collimation is less important.

The first plasma beam 402 preferably has sufficiently high energy to cause ions in the plasma beam to dissociate upon contact with the surface 202, and sufficiently low energy to prevent significant sputtering of the surface 202. That is, rather than material being removed by momentum transfer from the ions of the plasma beam to the surface, material in unmasked region 308 is removed primarily by a chemical reaction between a reactive molecule formed by the dissociation of ions in the plasma beam upon contact with the sample surface, the chemical reaction forming a volatile byproduct that is evacuated from the vacuum chamber. The energy of the ionized particles is preferably such that the material removal rate caused by sputtering is at least five times lower than that caused by chemical etching, preferably 10 times lower, more preferably 100 times lower, and most preferably 1000 times lower. The selectivity is such that the mask is preferably not completely removed when the etching process is completed, or at least the mask is in place long enough that the masked area is subject to an acceptable amount of etching. The combination of ion dissociation and sputter prevention is achieved by fine-tuning the ion landing energy at the surface. Typical energies lie in the range of 1 eV and 10 keV, and more preferably in the range of 10 eV and 500 eV. The ions from the plasma disassociate on contact with the surface 202 and etch the protective mask 304 little or not at all, while etching primarily the un-masked region 308.

Reactive plasma precursors that may be used include, for example, $SF_6$ and $XeF_2$, which can be used to form plasma beams composed of, for example, $SF_6^+$ and $XeF_2^+$, respectively.

FIG. 4 shows plasma beam 402 in the process of forming a trench 410 having sidewalls 412. It will be appreciated by those of ordinary skill in the art that the plasma etch process described above will tend to etch high aspect ratio trenches with significantly parallel sidewalls. This is so because (i) the plasma beam is collimated, (ii) the volatile byproducts do not re-deposit onto the pit sidewalls, and (iii) neutral gas molecules are reduced or eliminated inside the chamber containing the sample 200 by having the sample 200 positioned outside the plasma chamber. The last point is significant because the plasma beam gives rise to secondary electron emission from the sample. Said electrons can impact sidewalls 412, where they can dissociate adsorbed etch precursor gas molecules, giving rise to (typically undesired) lateral etching of the sidewalls. Such lateral etching is absent when neutral etch precursor molecules are not present inside the specimen chamber. In an ideal plasma source, only ionized gas molecules are extracted and used to form a plasma beam. In practice, neutral gas molecules diffuse into the plasma beam focusing column and the specimen chamber. In a preferred embodiment of the invention, the neutral molecules can be prevented from entering the specimen chamber by the employment of a differentially pumped plasma focusing column.

Figure 5:
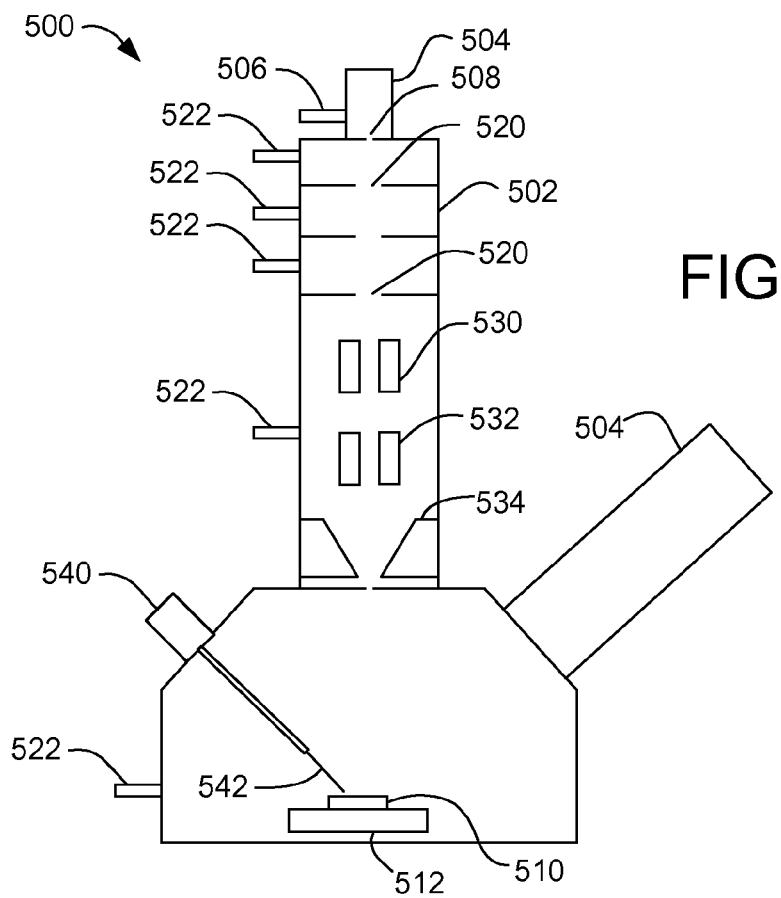
FIG. 5 shows schematically a dual beam system comprising an electron column, and the combination of a plasma chamber and a differentially pumped ion focusing column for the generation of a plasma beam

FIG. 5 shows schematically a dual-beam system 500 implementation of the present invention. System 500 includes an ion beam column 502 and an electron beam column 504. While ion beam column 502 is shown vertically oriented and electron beam column 504 is shown oriented at an angle to vertical, other embodiments may employ a vertical electron beam column 504 and a tilted ion beam column 502. Ion beam column 502 includes a plasma chamber 504 which is supplied with a gas or gasses through a gas inlet 506. Plasma chamber 504 can use, for example, an inductively coupled, magnetically enhanced plasma source to generate a plasma. Ionized gas molecules and some neutral gas molecules leave plasma chamber 504 through an aperture 508. Ions are accelerated toward a work piece 510 positioned on a positionable stage 512. A series of apertures 520 allow differential vacuum pumping along ion column 502, so that most of the neutral molecules that leave plasma chamber 504 can be removed from the ion column by various gas outlets 522 along column 502.

Ion column 502 includes a beam blanker 530 for blanking the ion beam and beam deflectors 532 for positioning the beam on the work piece 510 and scanning the beam. A lens 534 collimates or focuses the beam of ionized gas molecules. Unlike a typical semiconductor plasma processing system, in which the work piece is positioned in the plasma chamber, embodiments of the present invention separate the plasma chamber 504 from the work piece 510. This separation provides an opportunity to collimate or focus the beam as it travels through ion optical elements in the ion column, remove most of the neutral molecules thereby preventing them from reaching the work piece, and control the ion beam impact energy at the work piece.

It will be appreciated by those of ordinary skill in the art that the plasma etch process described above will be able to achieve very high material removal rates and very high lateral process resolution. The material removal rate is determined by the plasma beam current, and is not limited by adsorbate depletion in the surface region irradiated by the beam, a well known effect that often limits the process rates of gas-assisted charged particle beam etch and deposition processes.

Other attributes of the first plasma beam 402 are a comparatively larger beam diameter than one of a typical liquid metal ion source FIB, but smaller compared to a typical inductively coupled plasma ("ICP") reactor. It is contemplated that the beam diameter will range in size from several tens of nanometers to several millimeters. That is, the plasma beam is typically at least an order of magnitude and more preferably two or more orders of magnitude, greater than the diameter of the beam used to produce the protective layer. Thus, the beam that patterns the protective layer can create a complex pattern of features, and the plasma beam can encompass the entire pattern to etch the pattern in one step. The plasma beam diameter is typically less than one half of the substrate diameter, and more preferably less than one tenth of the substrate diameters. Thus, the process is typically used as a localized etching process, and not an entire wafer process. The current of the first plasma beam 402 may range from a few picoamps to several milliamps, but typical beam currents are more likely to range from 1 nanoamp to a few microamps.

For this process, a magnetically enhanced, inductively-coupled plasma source is preferred, as the high brightness of this source is particularly adept. Such an ICP source is described in U.S. Pat. App. Pub. 2005/0183667 to Keller et al. for "Magnetically Enhanced, Inductively Coupled Plasma Source for a Focused Ion Beam System." One of ordinary skill in the art will appreciate that the higher the brightness of the source, the more collimated the beam will be for a given beam current and, therefore, the more precise the etching will be. However, any other plasma ion source could also be used for this step such as, for example, a duoplasmatron, penning ion source or a capacitively coupled plasma source.

Reactive plasma precursors that may be used include, for example, SF6 and $XeF_2$. One preferred embodiment contemplates the use of $XeF_2$ in the second step when the protective layer was formed from tungsten due to the selectivity of $XeF_2$ for etching silicon over tungsten.

A non-reactive plasma gas can also be used together with an etchant precursor gas that is introduced into the vacuum chamber by a gas injection system 540 having a nozzle 542 positioned near the work piece 510. In such a case, rather than the molecules of the plasma reacting with the sample, the plasma molecules and secondary electrons emitted as a result of ion impact at the sample provide the energy to induce a reaction between the sample and an etch precursor that is introduced into the vacuum chamber near the sample. In some embodiments, argon can be used as in the plasma because it has a low ionization potential and, therefore, requires less energy to break down and sustain as a plasma beam. The argon can be used with a precursor gas, or the argon can be mixed with a reactive gas in the plasma chamber. In any case, it is preferable that the plasma beam and/or the combination of the plasma beam and an assisting gas be chosen to exhibit selectivity in this step to etch the exposed un-masked region 308 and not the protective mask 304.

Figure 6:
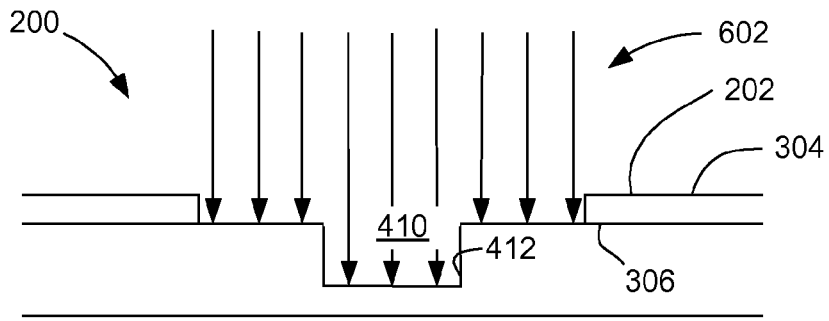
FIG. 6 shows the selective etching of the protective mask of FIGS. 2 and 3.

In a third step 106, the masking material is removed. Referring to FIG. 6, a second plasma beam 602 is directed toward the sample. In some embodiments, the beam is sufficiently large that it can remove the mask without scanning. Plasma beam 602 is selective for etching material of the protective mask 304 while not etching, or etching at a significantly lesser rate, the substrate sample 200. The mask material is preferably etched at a rate that is at least two times greater than the etch rate of the substrate material, more preferably at least five times greater, even more preferably at least ten times greater, and most preferably at least one hundred times greater.

For example, an oxygen ion plasma beam can be used to volatilize a carbonaceous mask, and a $XeF_2$ plasma beam can be used to remove a tungsten mask. In other embodiments, a number of gases can be mixed to produce a plasma beam with specific etch characteristics. For example, oxygen can be mixed with $SF_6$ in the plasma to enhance the etch rate of some substrates. For example, a mixture of $SF_6$ and 5% oxygen reduces the etch rate of silicon as compared to pure $SF_6$, but still etches metals such as tungsten very quickly. This gas mixture gives good selective etching of tungsten when the exposed substrate is $SiO_2$ at, or about, the ration of 10:1 for $W:SiO_2$. Alternatively, a pure oxygen plasma beam can be used to initially oxidize the entire surface, followed by the above-mentioned use of $SF_6$ and 5% oxygen. In other embodiments, the protective layer can also be removed by any convenient method, including focused ion beam milling, a selective chemical etching process or chemical mechanical polishing. The diameter of beam 602 in FIG. 6 is smaller than the mask area, so the beam 602 is scanned over the masked area.

In other embodiments of the invention, the mask may be removed by a standard focused ion beam sputter process (such as that employed in Ga liquid metal ion source FIB tools), or by a combination of chemical etching and physical sputtering. We note that such processes will cause an "over-etch" the unmasked region, but the over-etch will be negligible if, after step 104, the mask thickness is small relative to the depth of the etch pits produced in step 104.

While the foregoing description is exemplary of the preferred embodiment of the present invention, those of ordinary skill in the relevant arts will recognize the many variations, alterations, modifications, substitutions and the like as are readily possible, especially in light of this description, the accompanying drawings and claims drawn thereto. For example, the trench 410 can be filled by a gas-mediated charged particle beam-induced deposition process before or after the masking material 304 is removed in step 106. In any case, because the scope of the present invention is much broader than any particular embodiment, the foregoing detailed description should not be construed as a limitation of the scope of the present invention, which is limited only by the claims appended hereto.

The invention claimed is:

1. A method for etching a substrate to form microscopic structures, comprising:

forming a protective mask on one or more portions of a surface of the substrate using a focused beam process, the focused beam either depositing a masking material near the impact point of the beam by decomposing a precursor gas or the focused beam patterning an existing layer of masking material by etching the masking material near the impact point of the beam;

forming a structure in the substrate by directing a beam of ionized particles from a plasma source through an ion optical column toward the sample to selectively etch unmasked portions of the substrate, the ionized particles having sufficient energy upon contacting the substrate to chemically etch the unmasked portions, but insufficient energy to substantially sputter the unmasked portions;

removing the masking material by directing a second beam of ionized particles to selectively etch the masking material without substantially etching the substrate material, the ionized particles having sufficient energy upon contacting the surface to chemically etch the masked portions, but insufficient energy to sputter the masked portions.

2. The method of claim 1 in which forming a structure in the substrate by directing a beam of ionized particles from a plasma source through an ion optical column toward the sample to selectively etch unmasked portions of the substrate includes directing a beam of ionized particles to essentially complete forming the structure while at least a portion of the protective mask material remains.

3. The method of claim 1 in which forming a structure in the substrate by directing a beam of ionized particles from a plasma source through an ion optical column toward the sample to selectively etch unmasked portions of the substrate includes preventing neutral particles from the plasma source from reaching the substrate.

4. The method of claim 1 in which forming a protective mask includes directing a charged particle beam toward one or more portions of a surface of the substrate and in which forming a structure in the substrate includes directing a beam through a differentially pumped ion column to reduce the number of neutral particles impacting the substrate.

5. A method for etching a substrate to form microscopic structures, comprising:

forming a protective mask on one or more portions of a surface of the substrate, the protective mask forming a pattern and leaving unmasked areas of the substrate and generating ions in a plasma chamber;

forming ions from the plasma chamber into a beam, the ions in the beam having insufficient landing energy at the substrate surface to significantly sputter material from the substrate;

directing the beam of ionized particles from the plasma chamber through an ion optical column toward the substrate to selectively etch an unmasked portion of the substrate, the ion beam including ion optical elements for forming the beam and the ions inducing a chemical reaction to selectively remove substrate material from the unmasked areas while removing less material from the masked areas.

6. The method of claim 5, wherein directing the beam of ionized particles from the plasma chamber includes removing neutral particles that leave the plasma chamber before the neutral particles reach the substrate.

7. The method of claim 5, wherein directing the beam of ionized particles includes directing a beam having a diameter smaller than the masked area and sufficiently large to form multiple holes at unmasked areas.

8. The method of claim 5, wherein the ionized particles in the beam have sufficient energy to give rise to dissociation of the ionized particles in the beam upon contact with the sample surface.

9. The method of claim 5, wherein the ionized particles in the beam have an energy in the range of 10 eV and 500 eV.

10. The method of claim 5, wherein the beam is collimated.

11. The method of claim 5, wherein the beam is convergent.

12. The method of claim 5, wherein the beam has a substantially uniform ion flux profile across the unmasked region of the substrate surface.

13. The method of claim 5, wherein directing a beam of ionized particles from a plasma source includes directing the ionized particles through a differentially pumped ion optical column so as to minimize the concentration of neutral gas molecules inside the specimen chamber.

14. The method of claim 5, further comprising directing a second beam toward the sample, the second beam selectively etching the protective mask material more rapidly than the sample substrate material.

15. The method of claim 5, in which forming a protective mask on one or more portions of a surface of the substrate using a focused beam process includes directing a charged particle beam toward the one or more portions while directing a gas toward the one or more portions, the charged particle beam decomposing the gas to deposit the protective layer.

16. The method of claim 5, in which forming a protective mask on one or more portions of a surface of the substrate includes applying a masking material onto the surface and subsequently using a focused beam process to remove the masking material from surface areas other than the one or more portions.

17. The method of claim 5, in which directing a beam of ionized particles to selectively etch an unmasked portion of the sample includes directing a collimated beam of ions, the average energy of the ions being less than the energy required to sputter material from the sample.

18. The method of claim 5, in which directing a beam of ionized particles from the plasma chamber to selectively etch an unmasked portion of the sample includes directing a collimated beam of ions, the average energy of the ions being less than 500 eV.

19. The method of claim 5, further comprising directing a second beam toward the sample, the second beam etching both the protective mask material and substrate material through chemical etching, physical sputtering, or a combination of chemical etching and physical sputtering.

20. The method of claim 19, in which directing a charged particle beam toward the one or more portions includes directing an electron beam.

21. The method of claim 19, in which directing a charged particle beam toward the one or more portions includes directing an ion beam.

22. The method of claim 19, in which generating ions in a plasma chamber includes generating ion in a magnetically enhanced, inductively coupled plasma ion source.

* * * * *